(12) United States Patent
Uejima

(10) Patent No.: US 9,166,285 B2
(45) Date of Patent: Oct. 20, 2015

(54) HIGH-FREQUENCY MODULE

(71) Applicant: Murata Manufacturing Co., Ltd., Nagaokakyo-shi, Kyoto-fu (JP)

(72) Inventor: Takanori Uejima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 213 days.

(21) Appl. No.: 13/863,479

(22) Filed: Apr. 16, 2013

(65) Prior Publication Data

US 2013/0293438 A1 Nov. 7, 2013

(30) Foreign Application Priority Data

May 7, 2012 (JP) .................................. 2012-105974

(51) Int. Cl.
| | |
|---|---|
| H01Q 1/50 | (2006.01) |
| H04B 1/04 | (2006.01) |
| H04B 1/18 | (2006.01) |
| H05K 1/02 | (2006.01) |

(52) U.S. Cl.
CPC ............... *H01Q 1/50* (2013.01); *H04B 1/0458* (2013.01); *H04B 1/18* (2013.01); *H05K 1/025* (2013.01); *H05K 1/0243* (2013.01); *H05K 2201/09227* (2013.01)

(58) Field of Classification Search
USPC .......................................... 343/858, 841, 850
See application file for complete search history.

(56) References Cited

U.S. PATENT DOCUMENTS

| | | | | |
|---|---|---|---|---|
| 7,933,561 B2 * | 4/2011 | Sanguinetti | ..................... | 455/78 |
| 8,131,226 B1 | 3/2012 | Kemmochi et al. | | |
| 8,620,144 B2 * | 12/2013 | Barton et al. | ................. | 386/249 |
| 8,761,688 B2 * | 6/2014 | Wu et al. | .......................... | 455/73 |
| 8,803,632 B2 * | 8/2014 | Takeuchi | ....................... | 333/101 |
| 2003/0160322 A1 | 8/2003 | Hsieh et al. | | |
| 2005/0072828 A1 * | 4/2005 | Matsuura et al. | ............... | 228/37 |
| 2008/0246554 A1 * | 10/2008 | Notani et al. | ................. | 333/103 |
| 2009/0067103 A1 | 3/2009 | Kijima et al. | | |
| 2011/0260806 A1 | 10/2011 | Takeuchi | | |
| 2012/0293438 A1 * | 11/2012 | Chaudhri et al. | ............. | 345/173 |
| 2012/0306716 A1 * | 12/2012 | Satake et al. | ................. | 343/841 |
| 2012/0313743 A1 | 12/2012 | Kimura et al. | | |
| 2013/0176916 A1 | 7/2013 | Uejima | | |

FOREIGN PATENT DOCUMENTS

| | | |
|---|---|---|
| CN | 102204100 A | 9/2011 |
| JP | 61-140602 U | 8/1986 |

(Continued)

OTHER PUBLICATIONS

Official Communication issued in corresponding Japanese Patent Application No. 2012-105974, mailed on Feb. 4, 2014.

*Primary Examiner* — Huedung Mancuso
(74) *Attorney, Agent, or Firm* — Keating & Bennett, LLP

(57) ABSTRACT

A high-frequency module includes a switch IC and a matching circuit. The high-frequency module includes a multilayer body. The switch IC and an inductor of the matching circuit are mounted on a top surface of the multilayer body. A top-surface land electrode on which a common terminal of the switch IC is mounted is connected to one end of a wiring conductor through a via-conductor. The other end of the wiring conductor is connected to a top-surface land electrode on which a terminal electrode at one end of the inductor is mounted, through a via-conductor. An end portion of the inductor on the side connected to the common terminal of the switch IC is disposed near the common terminal. Thus, the length of the wiring conductor is shortened and a parasitic capacitance is decreased.

20 Claims, 9 Drawing Sheets

(56) References Cited

FOREIGN PATENT DOCUMENTS

| | | |
|---|---|---|
| JP | 2006-121211 A | 5/2006 |
| JP | 2006-310904 A | 11/2006 |
| JP | 2008-258420 A | 10/2008 |
| JP | 2008-271420 A | 11/2008 |
| JP | 2012-59937 A | 3/2012 |
| TW | 531866 B | 5/2003 |
| WO | 2006/064691 A1 | 6/2006 |
| WO | 2010/053131 A1 | 5/2010 |
| WO | 2012/043430 A1 | 4/2012 |

\* cited by examiner

HIGH-FREQUENCY MODULE

BACKGROUND OF THE INVENTION

1. Field of the Invention

The present invention relates to a high-frequency module that includes a switch integrated circuit (IC) and that transmits and receives a plurality of communication signals in a switching manner.

2. Description of the Related Art

Hitherto, various high-frequency modules that transmit and receive a plurality of communication signals using a common antenna have been suggested. In such a high-frequency module, it is necessary to connect terminals to which a plurality of communication signals are input or from which a plurality of communication signals are output to an antenna in a switching manner. Thus, for example, the high-frequency module described in Japanese Unexamined Patent Application Publication No. 2008-271420 includes a switch IC. A common terminal of the switch IC is connected to an antenna connection terminal of the high-frequency module. A plurality of switch terminals which are connected to the common terminal of the switch IC in a switching manner are respectively connected to individual input/output terminals of the high-frequency module.

In such a high-frequency module including a switch IC, a matching circuit for achieving impedance matching between a common terminal of the switch IC and an antenna may be provided between the switch IC and an antenna connection terminal.

An example of such a matching circuit is a band-pass-filter-type matching circuit including an inductor which is connected in series between a common terminal of a switch IC and an antenna connection terminal of a high-frequency module in order to cancel the off capacitance of the switch IC. The band-pass-filter-type matching circuit is formed of a low pass filter and a high pass filter.

Also, a matching circuit is provided between each input/output terminal and a corresponding switch terminal.

However, with a trend of increased utilization of a multi-band scheme for high-frequency modules, the frequency band of communication signals which are transmitted and received in a switching manner using a switch IC has become wider. Furthermore, with the decreasing size of communication terminals provided with high-frequency modules, there have been demands for further decreases in the size and height of high-frequency modules. Accordingly, there have been demands for further decreases in the size and height of individual elements included in high-frequency modules.

Therefore, a matching circuit according to the related art may be incapable of achieving sufficient impedance matching for all communication signals used in a high-frequency module. Accordingly, desired transmission characteristics are not always acquired between a common terminal and a specific input/output terminal. This is because a component such as a parasitic capacitance between a common terminal of a switch IC and an antenna connection terminal connected to the common terminal affects the impedance characteristics between the common terminal and the input/output terminal.

For example, in a case where impedance matching is performed with a band pass filter including a series-connected inductor as described above, cancelling of an off capacitance causes an inductance value to increase. Accordingly, in some cases, impedance matching is not achieved for a communication signal of a high-frequency band.

Also, in order to achieve matching in a specific frequency band, it is necessary to set a large capacitance of a capacitor which connects one end of an inductor providing the above-described band pass filter to a ground. However, a large capacitance may cause a decrease in cutoff frequency of a low pass filter providing the band pass filter. Accordingly, the insertion loss on the high-frequency side of the specific frequency band increases, and desired characteristics are not obtained in some cases.

SUMMARY OF THE INVENTION

Accordingly, preferred embodiments of the present invention provide a high-frequency module which realizes favorable transmission characteristics while also achieving impedance matching in a wide frequency band.

According to preferred embodiments of the present invention, a high-frequency module includes an antenna connection terminal, a plurality of input/output terminals, a switch IC, a matching circuit, and a multilayer body. The antenna connection terminal is connected to an antenna. Communication signals are respectively input to or output from the plurality of input/output terminals. The switch IC includes a plurality of switch terminals which are individually connected to the plurality of input/output terminals, and a common terminal which is connected to the antenna connection terminal, and connects the common terminal to each of the plurality of switch terminals in a switching manner. The matching circuit is connected between the common terminal of the switch IC and the antenna connection terminal. The multilayer body includes a plurality of electrically insulating layers which are stacked on top of one another. The switch IC is mounted on a top surface of the multilayer body. The matching circuit includes a first inductor which is connected in series between the common terminal of the switch IC and the antenna connection terminal. A first wiring line, which connects the first inductor and the common terminal, is shorter than a second wiring line, which connects the first inductor and the antenna connection terminal.

With this configuration, the first wiring line, which connects the first inductor and the common terminal, is short, and thus a parasitic capacitance of the first wiring line can be decreased. Accordingly, an influence of the parasitic capacitance on the impedance between an input/output terminal and the antenna connection terminal can be significantly reduced and prevented, and deterioration of an insertion loss can be significantly reduced and prevented.

Preferably, the first wiring line may be disposed so as not to overlap an inner-layer ground in the multilayer body in a stacking direction of the multilayer body.

With this configuration, the parasitic capacitance of the first wiring line can be further decreased.

The first inductor may be a surface-mount inductor which is mounted on the top surface. A first mount land which is provided for the first inductor and is connected to the first wiring line is nearer to a common-terminal mount land on which the common terminal is mounted than a second mount land which is provided for the first inductor and is connected to the second wiring line.

With this configuration, the first inductor is a surface-mount inductor, and the first wiring line can be shortened.

The first wiring line may have a width which is smaller than a width of the second wiring line.

With this configuration, the parasitic capacitance of the first wiring line can be further decreased.

The first inductor may include a plurality of substantially loop shaped linear conductors which are respectively arranged in certain electrically insulating layers among the plurality of electrically insulating layers, and may be spiral shaped or substantially spiral shaped with a winding axis extending in the stacking direction. A linear conductor in a top layer among the plurality of linear conductors is connected to a common-terminal mount land on which the common terminal is mounted through only a via-conductor extending in the stacking direction.

With this configuration, the first inductor is disposed in the multilayer body. In this case, the first wiring line can be shortened and the shape thereof can be simplified, and coupling with the inner-layer ground can be significantly reduced.

Preferably, the inner-layer ground may include a first inner-layer ground disposed on an upper side of the plurality of linear conductors, and a second inner-layer ground disposed on a lower side of the plurality of linear conductors. A distance in the stacking direction between the linear conductor in the top layer and the first inner-layer ground may be longer than a distance in the stacking direction between a linear conductor in a bottom layer among the plurality of linear conductors and the second inner-layer ground.

With this configuration, the first inductor is disposed in the multilayer body. In this case, coupling between the end portion on the common terminal side of the first inductor and the inner-layer ground can be significantly reduced and prevented, and the parasitic capacitance on the common terminal side of the first inductor can be significantly decreased.

According to various preferred embodiments of the present invention, favorable transmission characteristics can be realized while achieving impedance matching in a wide frequency band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
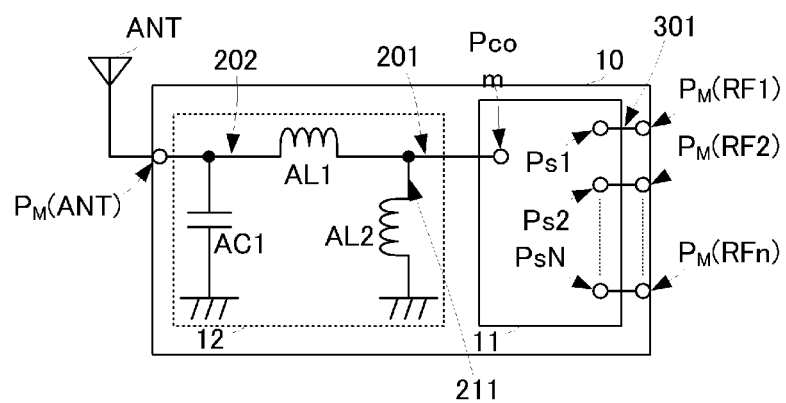
FIG. 1 is a circuit diagram of a high-frequency module according to a first preferred embodiment of the present invention.

A high-frequency module according to a first preferred embodiment of the present invention will be described with reference to the drawings. FIG. 1 is a circuit diagram of a high-frequency module 10 according to the first preferred embodiment of the present invention.

The high-frequency module 10 preferably includes an antenna connection terminal $P_M(ANT)$ and a plurality of input/output terminals $P_M(RF1)$ to $P_M(RFn)$. The high-frequency module 10 preferably includes a switch IC 11 and a matching circuit 12.

The switch IC 11 preferably includes a common terminal Pcom and a plurality of switch terminals Ps1 to PsN. The switch IC 11 is supplied with power by a drive voltage, and a combination of a plurality of control voltages causes the common terminal Pcom to be connected to any one of the plurality of switch terminals Ps1 to PsN.

The switch terminals Ps1 to PsN are connected to the input/output terminals $P_M(RF1)$ to $P_M(RFn)$ via certain wiring conductors, respectively. For example, the switch terminal Ps1 is connected to the input/output terminal $P_M(RF1)$ via a wiring conductor 301.

The matching circuit 12 preferably includes an inductor AL1 (corresponding to a "first inductor" of a preferred embodiment of the present invention), an inductor AL2 (corresponding to a "second inductor" of a preferred embodiment of the present invention), and a capacitor AC1. The inductor AL1 is connected between the common terminal Pcom and the antenna connection terminal $P_M(ANT)$. The inductor AL2 is connected between an end portion on the common terminal Pcom side of the inductor AL1 and a ground. The capacitor AC1 is connected between an end portion on the antenna connection terminal $P_M(ANT)$ side of the inductor AL1 and the ground.

With this circuit configuration, the matching circuit 12 functions as a band-pass-filter-type matching circuit defined by a high pass filter and a low pass filter.

One end of the inductor AL1 is connected to the common terminal Pcom via a wiring conductor 201 (corresponding to a "first wiring line" of a preferred embodiment of the present invention). The other end of the inductor AL1 is connected to the antenna connection terminal $P_M(ANT)$ via a wiring conductor 202 (corresponding to a "second wiring line" of a preferred embodiment of the present invention).

An end portion on the inductor AL1 side of the inductor AL2 is connected to the one end of the inductor AL1 via a wiring conductor 211. In the circuit diagram, the wiring conductor 211 is connected to the wiring conductor 201. However, in a case where the high-frequency module 10 is defined by a multilayer body, as will be described below, the wiring conductor 211 is directly connected to the one end of the inductor AL1.

Figure 2A:
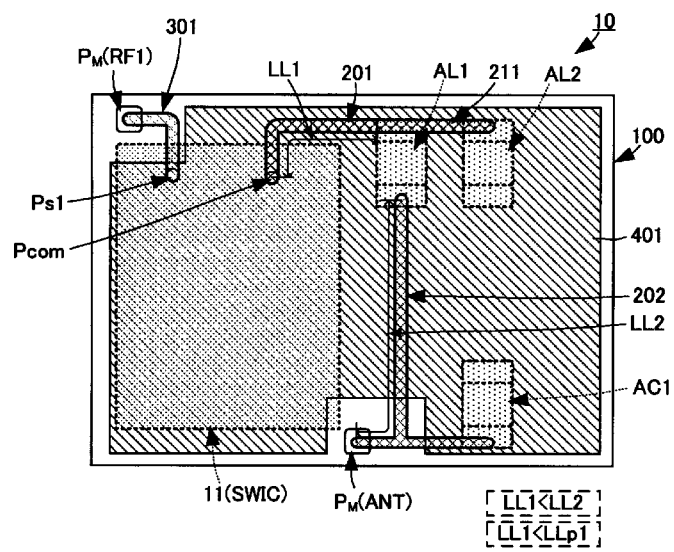
FIG. 2A is a perspective plan view illustrating a characteristic structure of the high-frequency module according to the first preferred embodiment of the present invention.

The high-frequency module 10 including such a circuit configuration has a structure illustrated in FIG. 2A. FIG. 2A is a perspective plan view illustrating a characteristic structure of the high-frequency module 10 according to the first preferred embodiment of the present invention. In this perspective view, characteristic portions of a preferred embodiment of the present invention are selectively illustrated.

The high-frequency module 10 includes a multilayer body 100. The multilayer body 100 includes a plurality of substantially flat-plate-shaped electrically insulating layers which are stacked on top of one another. The individual electrically insulating layers are stacked such that the flat surfaces thereof are parallel with one another. Among the electrically insulating layers, a certain electrically insulating layer is provided with an inner-layer ground 401 over almost the entire surface in plan view of the multilayer body 100.

The bottom surface of the multilayer body 100 is provided with a mount land permitting external connection of the antenna connection terminal $P_M$(ANT), and mount lands permitting external connection which respectively provide the plurality of input/output terminals $P_M$(RF1) to $P_M$(RFn). The inner-layer ground 401 is connected to a mount land permitting external ground connection on the bottom surface of the multilayer body 100 through a via-conductor arranged in the multilayer body 100 (hereinafter simply referred to as a via-conductor).

The top surface of the multilayer body 100 is provided with top-surface land electrodes with a certain pattern, and the inductors AL1 and AL2 and the capacitor AC1 which are defined of surface-mount circuit elements, and the surface-mount switch IC (SWIC) 11 of an LGA type are mounted thereon.

In plan view (along the stacking direction) of the multilayer body 100, the inductor AL1 is preferably mounted at a position nearer to the top-surface land electrode of the common terminal Pcom of the switch IC 11 than the mount land permitting external connection of the antenna connection terminal $P_M$(ANT).

The top-surface land electrode of the switch terminal Ps1 of the switch IC 11 is connected to, through a via-conductor, one end of the wiring conductor 301 which is arranged on a certain electrically insulating layer of the multilayer body 100. The other end of the wiring conductor 301 is connected to the mount land permitting external connection of the input/output terminal $P_M$(RF1) through a via-conductor.

Also, the top-surface land electrodes of the other switch terminals Ps2 to PsN are preferably connected to the mount lands permitting external connection of the other input/output terminals $P_M$(RF2) to $P_M$(RFn), respectively.

The top-surface land electrode on which the common terminal Pcom of the switch IC 11 is mounted is connected to, through a via-conductor, one end of the wiring conductor 201 which is arranged on the certain electrically insulating layer. The other end of the wiring conductor 201 is connected to, through a via-conductor, the top-surface land electrode on which a terminal electrode at one end of the inductor AL1 is mounted (corresponding to a "first mount land" of a preferred embodiment of the present invention).

The other end of the wiring conductor 201 is connected to one end of the wiring conductor 211. The other end of the wiring conductor 211 is connected to, through a via-conductor, the top-surface land electrode on which a terminal electrode at one end of the inductor AL2 is mounted.

The top-surface land electrode on which a terminal electrode at the other end of the inductor AL1 is mounted (corresponding to a "second mount land" of a preferred embodiment of the present invention) is connected to one end of the wiring conductor 202 via a via-electrode. The vicinity of the other end of the wiring conductor 202 is branched into two lines. One of the two lines is connected to, through a via-conductor, the mount land permitting external connection of the antenna connection terminal $P_M$(ANT). The other is connected to, through a via-conductor, the top-surface land electrode on which one terminal electrode of the capacitor AC1 is mounted.

As described above, in plan view of the multilayer body 100, the inductor AL1 is mounted at a position nearer to the top-surface land electrode of the common terminal Pcom of the switch IC 11 than the mount land permitting external connection of the antenna connection terminal $P_M$(ANT). Thus, the wiring conductor 201 is shorter than the wiring conductor 202. In the example illustrated in FIG. 2A, the length LL1 of the wiring conductor 201 is shorter than the length LL2 of the wiring conductor 202 (LL1<LL2).

As illustrated in FIG. 2A, the terminal electrode at one end of the inductor AL1 is preferably mounted at a position near the top-surface land electrode of the common terminal Pcom of the switch IC 11, and thus the absolute length of the wiring conductor 201, which has a large influence on matching characteristics, can be shortened. Accordingly, a parasitic capacitance generated by the wiring conductor 201 can be decreased, and the insertion loss of the high-frequency module 10 can be decreased.

Figure 2B:
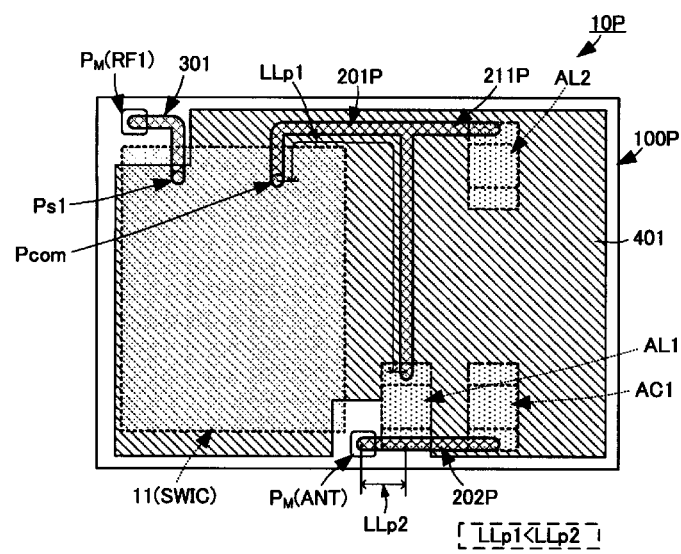
FIG. 2B is a perspective plan view illustrating the structure of a high-frequency module according to the related art.
Figure 3A:
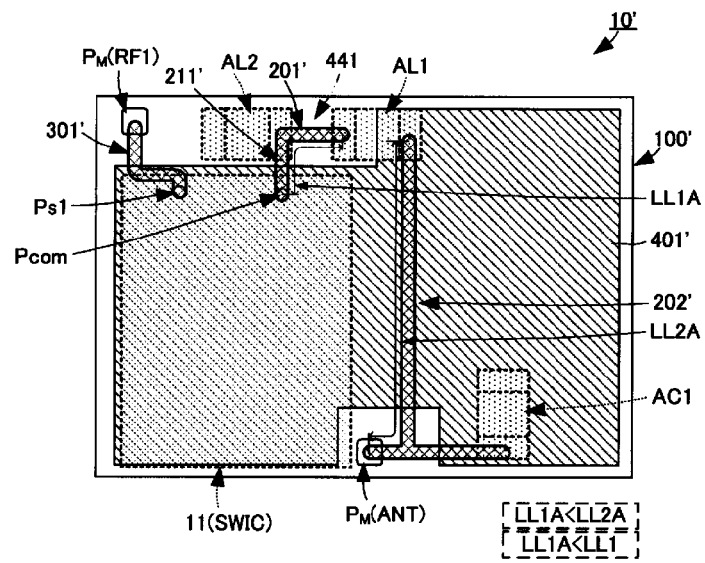
FIG. 3A is a perspective plan view illustrating the structure of a high-frequency module according to a modification of the first preferred embodiment of the present invention.
Figure 3B:
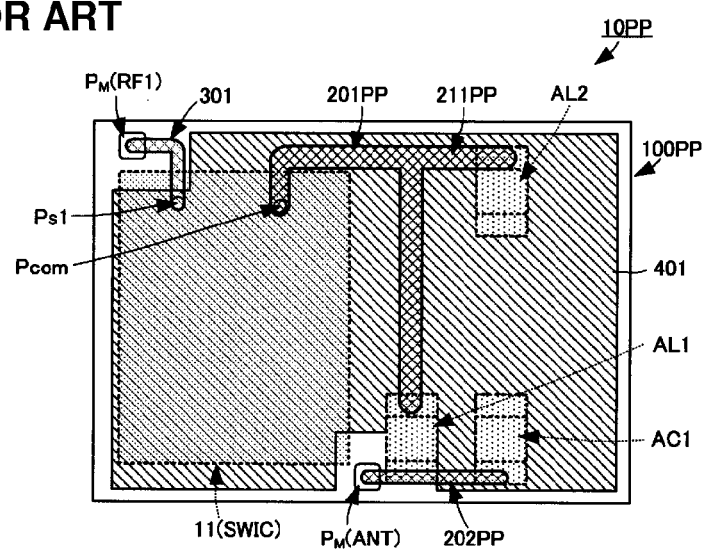
FIG. 3B is a perspective plan view illustrating the structure of a high-frequency module according to the related art.

To verify the effects of the configuration according to a preferred embodiment of the present invention, description will be given of a result of comparison (simulation) between the characteristic of the high-frequency module 10 having the structure according to the first preferred embodiment and the characteristics of high-frequency modules 10', 10P, and 10PP having other configurations. The high-frequency modules 10P and 10PP have structures according to the related art of the present application, whereas the high-frequency module 10' has a structure designed by modifying the structure of the first preferred embodiment of the present invention. FIG. 2B is a perspective plan view illustrating the structure of the high-frequency module 10P according to the related art. FIG. 3A is a perspective plan view illustrating the structure of the high-frequency module 10' according to a modification of the first preferred embodiment of the present invention. FIG. 3B is a perspective plan view illustrating the structure of the high-frequency module 10PP according to the related art.

As illustrated in FIG. 2B, in the high-frequency module 10P according to the related art, the inductor AL1 is mounted at a position nearer to the mount land permitting external connection of the antenna connection terminal $P_M$(ANT) than the top-surface land electrode of the common terminal Pcom of the switch IC 11 in plan view of a multilayer body 100P. Thus, the length LLp1 of a wiring conductor 201P which connects the top-surface land electrode of the common terminal Pcom and the terminal electrode at one end of the inductor AL1 is longer than the length LLp2 of a wiring conductor 202P which connects the mount land permitting external connection of the antenna connection terminal $P_M$(ANT) and the terminal electrode at the other end of the inductor AL1 (LLp1>LLp2). The length LLp1 of the wiring conductor 201P is much longer than the length LL1 of the wiring conductor 201. With this configuration, the area in which the wiring conductor 201P and the inner-layer ground 401 face each other is large, and a parasitic capacitance increases accordingly.

As illustrated in FIG. 3B, a wiring conductor 201PP of the high-frequency module 10PP of a multilayer body 100PP according to the related art is wider than the wiring conductor 201P of the high-frequency module 10P illustrated in FIG. 2B. Additionally, an end portion on the inductor AL1 side of the inductor AL2 is connected to the one end of the inductor AL1 via a wiring conductor 211PP. With this configuration, the area in which the wiring conductor 201PP and the inner-layer ground 401 face each other is large, and a parasitic capacitance increases accordingly.

On the other hand, in the high-frequency module 10' according to the modification of the first preferred embodiment illustrated in FIG. 3A, the switch terminals Ps1 to PsN are connected to the input/output terminals $P_M(RF1)$ to $P_M(RFn)$ via certain wiring conductors, respectively. For example, the switch terminal Ps1 is connected to the input/output terminal $P_M(RF1)$ via a wiring conductor 301'. Additionally, the terminal electrode at one end of the inductor AL1 is preferably mounted at a position nearer to the top-surface land electrode of the common terminal Pcom of the switch IC 11 than in the first preferred embodiment and an end portion on the inductor AL1 side of the inductor AL2 is connected to the one end of the inductor AL1 via a wiring conductor 211'. Accordingly, the length LL1A of a wiring conductor 201' of the high-frequency module 10' is shorter than the length LL1 of the wiring conductor 201 of the high-frequency module 10. Also in the example illustrated in FIG. 3A, the length LL1A of the wiring conductor 201' is shorter than the length LL2A of the wiring conductor 202' (LL1A<LL2A). Furthermore, in the high-frequency module 10', an inner-layer ground 401' is provided such that a conductor non-formation portion 441 is provided at a position overlapping the wiring conductor 201', in plan view of a multilayer body 100'. With this configuration, a parasitic capacitance generated by the wiring conductor 201' is preferably even less than a parasitic capacitance generated by the wiring conductor 201. Accordingly, the insertion loss of the high-frequency module 10' can be further decreased.

Figure 4:
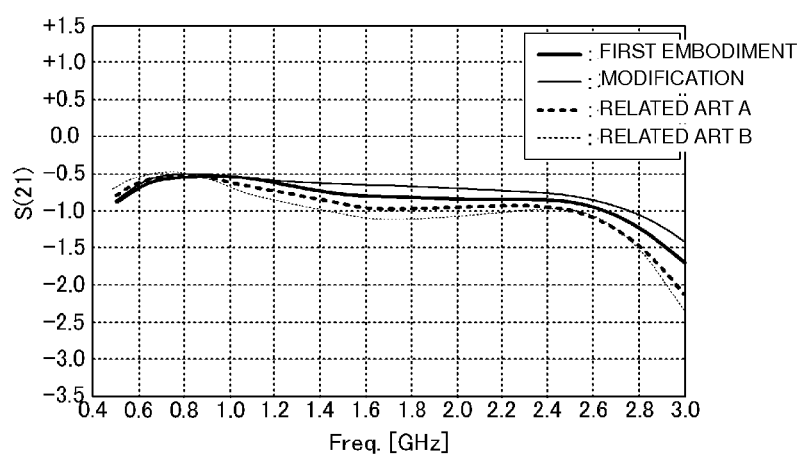
FIG. 4 illustrates a simulation result of transmission characteristics of the high-frequency module according to the first preferred embodiment, the high-frequency module according to the modification, and the high-frequency modules according to the related art.

FIG. 4 illustrates a simulation result of transmission characteristics of the high-frequency modules 10 and 10' according to the first preferred embodiment and the illustrated modification of the first preferred embodiment, and the high-frequency modules 10P and 10PP having the configurations according to the related art. FIG. 4 illustrates transmission characteristics of the direction from the input/output terminal $P_M(RF1)$ to the antenna connection terminal $P_M(ANT)$ side. In FIG. 4, "first preferred embodiment" corresponds to the structure of the high-frequency module 10, "modification" corresponds to the structure of the high-frequency module 10', "related art A" corresponds to the structure of the high-frequency module 10P, and "related art B" corresponds to the structure of the high-frequency module 10PP.

As illustrated in FIG. 4, the high-frequency modules 10 and 10' according to the first preferred embodiment and the illustrated modification of the first preferred embodiment are capable of transmitting communication signals in a wider frequency band and with a smaller loss than the high-frequency modules 10P and 10PP according to the related art. Accordingly, the insertion loss can be decreased. With the use of the configuration of the high-frequency module 10', the insertion loss can be further decreased.

In addition, a smaller width of the wiring conductor 201 which connects the terminal electrode at one end of the inductor AL1 and the common terminal Pcom of the switch IC 11 enables a further decrease in parasitic capacitance.

Figure 5:
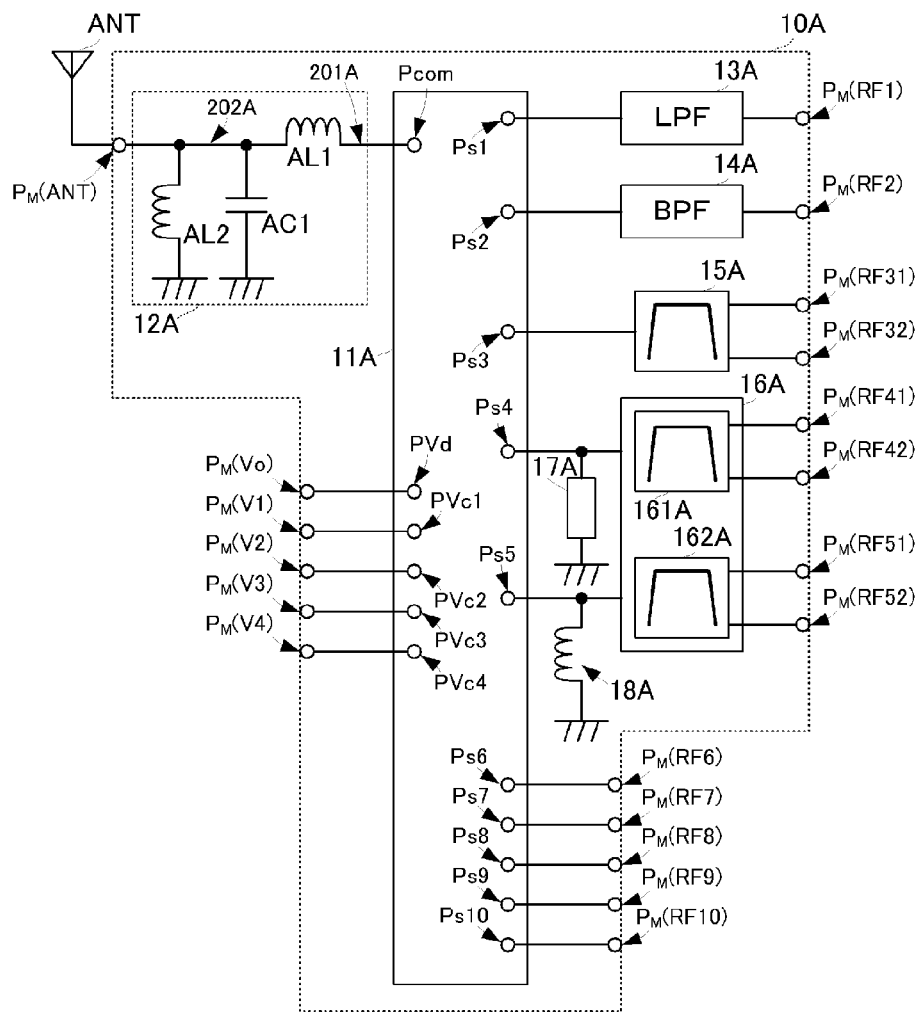
FIG. 5 is a circuit diagram of a high-frequency module according to a second preferred embodiment of the present invention.

Next, a high-frequency module according to a second preferred embodiment of the present invention will be described with reference to the drawings. FIG. 5 is a circuit diagram of a high-frequency module 10A according to the second preferred embodiment of the present invention.

The high-frequency module 10A preferably includes an antenna connection terminal $P_M(ANT)$ and a plurality of input/output terminals $P_M(RF1)$, $P_M(RF2)$, $P_M(RF31)$, $P_M(RF32)$, $P_M(RF41)$, $P_M(RF42)$, $P_M(RF51)$, $P_M(RF52)$, $P_M(RF6)$, $P_M(RF7)$, $P_M(RF8)$, $P_M(RF9)$, and $P_M(RF10)$. The high-frequency module 10A includes a switch IC 11A, a matching circuit 12A, a low pass filter (LPF) 13A, a band pass filter (BPF) 14A, a surface acoustic wave (SAW) filter 15A, and a SAW duplexer 16A.

The switch IC 11A preferably includes a common terminal Pcom and a plurality of switch terminals Ps1 to Ps10. The switch IC 11A preferably includes a power supply terminal PVd and control terminals PVc1, PVc2, PVc3, and PVc4. The power supply terminal PVd and the control terminals PVc1, PVc2, PVc3, and PVc4 are preferably connected to a module-side power supply terminal $P_M(V0)$ and module-side control terminals $P_M(V1)$, $P_M(V2)$, $P_M(V3)$, and $P_M(V4)$, respectively. The switch IC 11A is supplied with power via the module-side power supply terminal $P_M(V0)$ and the power supply terminal PVd, and a combination of a plurality of control voltages applied via the module-side control terminals $P_M(V1)$, $P_M(V2)$, $P_M(V3)$, and $P_M(V4)$ and the control terminals PVc1, PVc2, PVc3, and PVc4 causes the common terminal Pcom to be connected to any one of the plurality of switch terminals Ps1 to Ps10.

The switch terminal Ps1 is preferably connected to the input/output terminal $P_M(RF1)$ via the LPF 13A.

The switch terminal Ps2 is preferably connected to the input/output terminal $P_M(RF2)$ via the BPF 14A.

The switch terminal Ps3 is preferably connected to the balanced input/output terminals $P_M(RF31)$ and $P_M(RF32)$ via the SAW filter 15A.

The switch terminal Ps4 is preferably connected to the balanced input/output terminals $P_M(RF41)$ and $P_M(RF42)$ via a SAW filter 161A of the SAW duplexer 16A. A connection line between the switch terminal Ps4 and the SAW filter 161A is grounded via an inductor 17A. With this configuration, a matching circuit between the switch terminal Ps4 and the SAW filter 161A is provided.

The switch terminal Ps5 is preferably connected to the balanced input/output terminals $P_M(RF51)$ and $P_M(RF52)$ via a SAW filter 162A of the SAW duplexer 16A. A connection line between the switch terminal Ps5 and the SAW filter 162A is grounded via an inductor 18A. With this configuration, a matching circuit between the switch terminal Ps5 and the SAW filter 162A is provided.

The switch terminals Ps6 to Ps10 are preferably connected to the input/output terminals $P_M(RF6)$ to $P_M(RF10)$, respectively.

The matching circuit 12A preferably includes an inductor AL1 (corresponding to the "first inductor" of a preferred embodiment of the present invention), an inductor AL2 (corresponding to the "second inductor" of a preferred embodiment of the present invention), and a capacitor AC1. The inductor AL1 is preferably connected between the common terminal Pcom and the antenna connection terminal $P_M(ANT)$. The inductor AL2 and the capacitor AC1 are preferably connected between an end portion on the antenna connection terminal $P_M(ANT)$ side of the inductor AL1 and the ground.

Figure 6A:
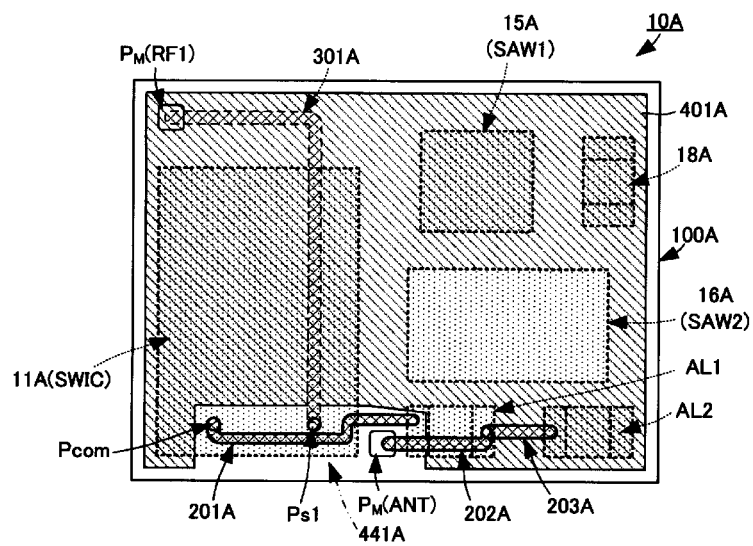
FIG. 6A is a perspective plan view illustrating a characteristic structure of the high-frequency module according to the second preferred embodiment of the present invention.

The high-frequency module 10A including such a circuit configuration preferably has a structure illustrated in FIG. 6A. FIG. 6A is a perspective plan view illustrating a characteristic structure of the high-frequency module 10A according to the second preferred embodiment of the present invention. In this perspective view, characteristic portions of a preferred embodiment of the present invention are selectively illustrated.

The high-frequency module 10A includes a multilayer body 100A. The multilayer body 100A includes a plurality of substantially flat-plate-shaped electrically insulating layers which are stacked on top of one another. The individual electrically insulating layers are stacked such that the flat surfaces thereof are parallel with one another. Among the electrically insulating layers, a certain electrically insulating layer is preferably provided with an inner-layer ground 401A over almost the entire surface in plan view of the multilayer body 100A.

The bottom surface of the multilayer body 100A is provided with a mount land permitting external connection of the antenna connection terminal $P_M(ANT)$, mount lands permitting external connection which respectively define the plurality of input/output terminals $P_M(RF1)$ to $P_M(RF10)$, and mount lands permitting external connection which respectively define the module-side control terminals $P_M(V1)$, $P_M(V2)$, $P_M(V3)$, and $P_M(V4)$. The inner-layer ground 401A is connected to a mount land permitting external ground connection on the bottom surface of the multilayer body 100A through a via-conductor arranged in the multilayer body 100A (hereinafter simply referred to as a via-conductor).

The top surface of the multilayer body 100A is preferably provided with top-surface land electrodes with a certain pattern, and the inductors AL1 and AL2, the inductor 18A, the switch IC 11A, the SAW filter 15A, and the SAW duplexer 16A which are defined by surface-mount circuit elements are mounted thereon.

In this case, the inductor AL1 is preferably mounted at a position near the top-surface land electrode of the common terminal Pcom of the switch IC 11A in plan view of the multilayer body 100A. Also, the inductor AL1 is mounted such that the end portion (one end) thereof connected to the common terminal Pcom is nearer to the switch IC 11A than the end portion (other end) thereof connected to the antenna connection terminal $P_M(ANT)$.

The other circuit elements defining the circuit illustrated in FIG. 5, for example, the circuit elements defining the LPF 13A and the BPF 14A, are provided by a conductor pattern arranged in the multilayer body 100A.

The top-surface land electrode of the switch terminal Ps1 of the switch IC 11 is preferably connected to, through a via-conductor, one end of a wiring conductor 301A which is arranged on a certain electrically insulating layer of the multilayer body 100A. The other end of the wiring conductor 301A is preferably connected to the mount land permitting external connection of the input/output terminal $P_M(RF1)$ through a via-conductor.

Also, the top-surface land electrodes of the other switch terminals Ps2 to Ps10 are connected to the mount lands permitting external connection of the other input/output terminals $P_M(RF2)$ to $P_M(RF10)$, respectively.

The top-surface land electrode on which the common terminal Pcom of the switch IC 11A is mounted is preferably connected to, through a via-conductor, one end of a wiring conductor 201A which is arranged on the certain electrically insulating layer. The other end of the wiring conductor 201A is preferably connected to, through a via-conductor, the top-surface land electrode on which the terminal electrode at one end of the inductor AL1 is mounted.

As described above, one end of the inductor AL1 is near the common terminal Pcom of the switch IC 11A, and thus the length of the wiring conductor 201A is short. Accordingly, a parasitic capacitance generated by the wiring conductor 201A can be decreased.

Furthermore, in the configuration according to the second preferred embodiment illustrated in FIG. 6A, the top-surface land electrode of the terminal electrode at one end of the inductor AL1 and the top-surface land electrode of the common terminal Pcom of the switch IC 11A are disposed substantially linearly along an end surface of the multilayer body 100A. The wiring conductor 201A is arranged so as to connect these top-surface land electrodes substantially linearly. With this configuration, the length of the wiring conductor 201A can be further shortened, and a parasitic capacitance can be further decreased.

Furthermore, in the configuration according to the second preferred embodiment, the inner-layer ground 401A preferably includes a conductor non-formation portion 441A so that the inner-layer ground 401A does not overlap the wiring conductor 201A in plan view of the multilayer body 100A. With this configuration, a parasitic capacitance generated by the wiring conductor 201A can be decreased.

The top-surface land electrode on which the terminal electrode at the other end of the inductor AL1 is mounted is preferably connected to one end of a wiring conductor 202A through a via-conductor. The other end of the wiring conductor 202A is preferably connected to the mount land permitting external connection of the antenna connection terminal $P_M(ANT)$ through a via-conductor.

The top-surface land electrode on which the terminal electrode at the other end of the inductor AL1 is mounted is preferably connected to one end of a wiring conductor 203A through a via-conductor. The other end of the wiring conductor 203A is preferably connected to, through a via-conductor, the top-surface land electrode on which the terminal electrode at one end of the inductor AL2 is mounted.

Figure 6B:
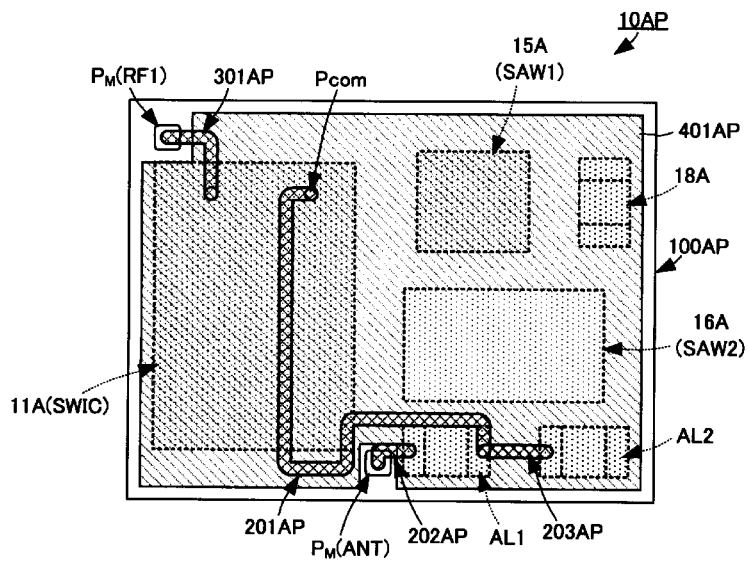
FIG. 6B is a perspective plan view illustrating the structure of a high-frequency module according to the related art.

To verify the effects of the configuration according to the second preferred embodiment, description will be given of a result of comparison (simulation) between the characteristic of the high-frequency module 10A having the structure according to the second preferred embodiment and the characteristic of a high-frequency module 10AP having a structure according to the related art different from the second preferred embodiment. FIG. 6B is a perspective plan view illustrating the structure of the high-frequency module 10AP according to the related art.

As illustrated in FIG. 6B, in the high-frequency module 10AP according to the related art, the inductor AL1 is mounted near the end surface opposite to the end surface where the common terminal Pcom of the switch IC 11A is arranged. With this configuration, the inductor AL1 is far from the top-surface land electrode of the common terminal Pcom of the switch IC 11A in plan view of the multilayer body 100AP. Thus, the inductor AL1 is mounted at a position nearer to the mount land permitting external connection of the antenna connection terminal $P_M(ANT)$ than the top-surface land electrode of the common terminal Pcom of the switch IC 11A. Thus, the absolute length of a wiring conductor 201AP is longer than the length of a wiring conductor 202AP. Also, the wiring conductor 201AP and an inner-layer ground 401AP face each other over the entire length of the wiring conductor 201AP. With this configuration, the area in which the wiring conductor 201AP and the inner-layer ground 401AP face each other is large, and a parasitic capacitance increases. The high-frequency module 10AP according to the related art also includes a wiring conductor 301AP which is arranged on a certain electrically insulating layer of the multilayer body 100AP.

Figure 7:
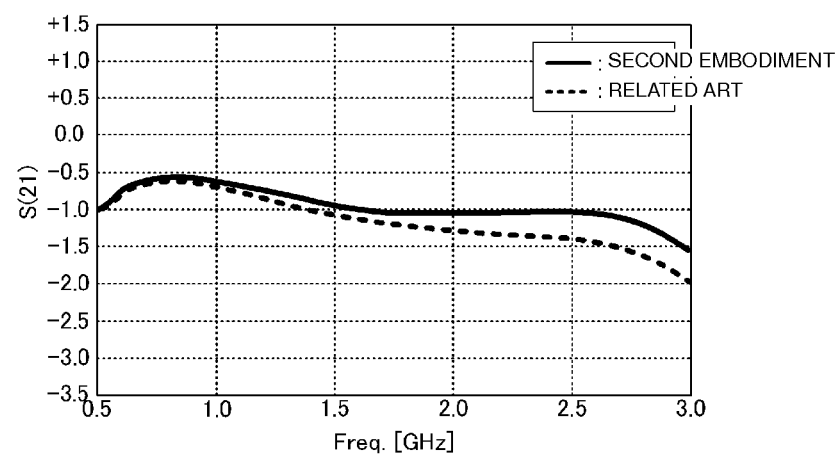
FIG. 7 illustrates a simulation result of transmission characteristics of the high-frequency module according to the second preferred embodiment and the high-frequency module according to the related art.

FIG. 7 illustrates a simulation result of transmission characteristics of the high-frequency module 10A according to the second preferred embodiment and the high-frequency module 10AP having the configuration according to the related art. FIG. 7 illustrates transmission characteristics of the direction from the input/output terminal $P_M(RF1)$ to the antenna connection terminal $P_M(ANT)$ side. In FIG. 7, "second preferred embodiment" corresponds to the structure of the high-frequency module 10A, and "related art" corresponds to the structure of the high-frequency module 10AP.

As illustrated in FIG. 7, the high-frequency module 10A according to the second preferred embodiment is capable of decreasing an insertion loss compared to the high-frequency module 10AP according to the related art, and is thus capable of transmitting communication signals with low loss in a wide frequency band.

In the configuration according to the second preferred embodiment, as illustrated in the circuit diagram in FIG. 5, the inductor AL2 is preferably connected to the antenna connection terminal $P_M(ANT)$ side of the inductor AL1. With this configuration, only the common terminal Pcom of the switch IC 10A is connected to the inductor AL1. Accordingly, the shape of the wiring conductor 201A which connects the inductor AL1 and the common terminal Pcom is simplified, and the length thereof can be shortened. Accordingly, a parasitic capacitance generated by the wiring conductor 201A can be decreased.

Figure 8:
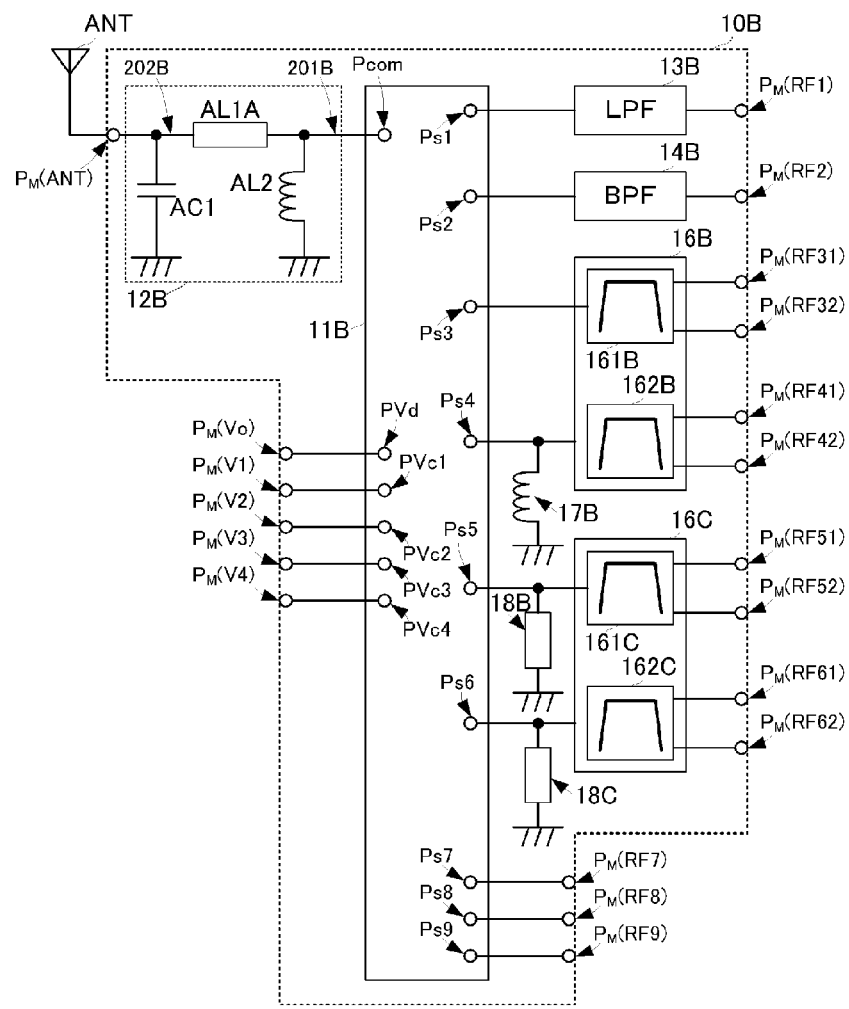
FIG. 8 is a circuit diagram of a high-frequency module according to a third preferred embodiment of the present invention.

Next, a high-frequency module according to a third preferred embodiment of the present invention will be described with reference to the drawings. FIG. 8 is a circuit diagram of a high-frequency module 10B according to the third preferred embodiment of the present invention.

The high-frequency module 10B preferably includes an antenna connection terminal $P_M(ANT)$ and a plurality of input/output terminals $P_M(RF1)$, $P_M(RF2)$, $P_M(RF31)$, $P_M(RF32)$, $P_M(RF41)$, $P_M(RF42)$, $P_M(RF51)$, $P_M(RF52)$, $P_M(RF61)$, $P_M(RF62)$, $P_M(RF7)$, $P_M(RF8)$, and $P_M(RF9)$. The high-frequency module 10B preferably includes a switch IC 11B, a matching circuit 12B, an LPF 13B, a BPF 14B, and SAW duplexers 16B and 16C.

The switch IC 11B preferably includes a common terminal Pcom and a plurality of switch terminals Ps1 to Ps9. The switch IC 11B preferably includes a power supply terminal PVd and control terminals PVc1, PVc2, PVc3, and PVc4. The power supply terminal PVd and the control terminals PVc1, PVc2, PVc3, and PVc4 are preferably connected to a module-side power supply terminal $P_M(V0)$ and module-side control terminals $P_M(V1)$, $P_M(V2)$, $P_M(V3)$, and $P_M(V4)$, respectively. The switch IC 11B is preferably supplied with power via the module-side power supply terminal $P_M(V0)$ and the power supply terminal PVd, and a combination of a plurality of control voltages applied via the module-side control terminals $P_M(V1)$, $P_M(V2)$, $P_M(V3)$, and $P_M(V4)$ and the control terminals PVc1, PVc2, PVc3, and PVc4 causes the common terminal Pcom to be connected to any one of the plurality of switch terminals Ps1 to Ps9.

The switch terminal Ps1 is preferably connected to the input/output terminal $P_M(RF1)$ via the LPF 13B.

The switch terminal Ps2 is preferably connected to the input/output terminal $P_M(RF2)$ via the BPF 14B.

The switch terminal Ps3 is preferably connected to the balanced input/output terminals $P_M(RF31)$ and $P_M(RF32)$ via a SAW filter 161B of the SAW duplexer 16B.

The switch terminal Ps4 is preferably connected to the balanced input/output terminals $P_M(RF41)$ and $P_M(RF42)$ via a SAW filter 162B of the SAW duplexer 16B. The connection line between the switch terminal Ps4 and the SAW filter 162B is grounded via an inductor 17B. With this configuration, a matching circuit between the switch terminal Ps4 and the SAW filter 162B is provided.

The switch terminal Ps5 is preferably connected to the balanced input/output terminals $P_M(RF51)$ and $P_M(RF52)$ via a SAW filter 161C of the SAW duplexer 16C. The connection line between the switch terminal Ps5 and the SAW filter 161C is grounded via an inductor 18B. With this configuration, a matching circuit between the switch terminal Ps5 and the SAW filter 161C is provided.

The switch terminal Ps6 is preferably connected to the balanced input/output terminals $P_M(RF61)$ and $P_M(RF62)$ via a SAW filter 162C of the SAW duplexer 16C. The connection line between the switch terminal Ps6 and the SAW filter 162C is grounded via an inductor 18C. With this configuration, a matching circuit between the switch terminal Ps6 and the SAW filter 162C is provided.

The switch terminals Ps7 to Ps9 are preferably connected to the input/output terminals $P_M(RF7)$ to $P_M(RF9)$, respectively.

The matching circuit 12B includes an inductor AL1A (corresponding to the "first inductor" of a preferred embodiment of the present invention), an inductor AL2 (corresponding to the "second inductor" of a preferred embodiment of the present invention), and a capacitor AC1. The inductor AL1A is preferably connected in series between the common terminal Pcom and the antenna connection terminal $P_M(ANT)$. The inductor AL2 is preferably connected between an end portion on the common terminal Pcom side of the inductor AL1A and the ground. The capacitor AC1 is preferably connected between an end portion on the antenna connection terminal $P_M(ANT)$ side of the inductor AL1A and the ground.

Figure 9:
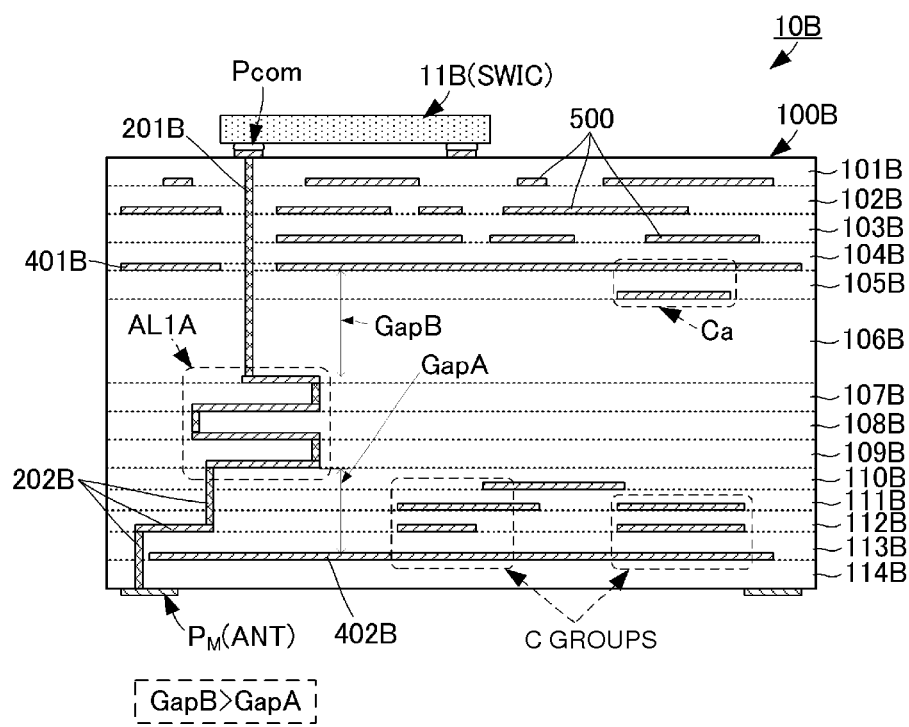
FIG. 9 is a side cross-sectional view illustrating a characteristic structure of the high-frequency module according to the third preferred embodiment of the present invention.

The high-frequency module 10B including such a circuit configuration has the structure illustrated in FIG. 9. FIG. 9 is a side cross-sectional view illustrating a characteristic structure of the high-frequency module 10B according to the third preferred embodiment of the present invention. In this cross-sectional view, characteristic portions of a preferred embodiment of the present invention are selectively illustrated.

The high-frequency module 10B includes a multilayer body 100B. The multilayer body 100B includes a plurality of substantially flat-plate-shaped electrically insulating layers 101B to 114B which are stacked on top of one another. The individual electrically insulating layers 101B to 114B are stacked such that the electrically insulating layer 101B serves as a top layer and the electrically insulating layer 114B serves as a bottom layer. The number of stacked electrically insulating layers is merely an example, and any number of layers may be appropriately set in accordance with desired specifications.

The bottom surface of the multilayer body 100B is provided with a mount land permitting external connection of the antenna connection terminal $P_M(ANT)$, mount lands permitting external connection which respectively constitute the plurality of input/output terminals $P_M(RF1)$ to $P_M(RF9)$, a mount land permitting external connection which constitutes the module-side power supply terminal $P_M(V0)$, and mount lands permitting external connection which constitute the module-side control terminals $P_M(V1)$, $P_M(V2)$, $P_M(V3)$, and $P_M(V4)$.

The top surface of the multilayer body 100B is provided with top-surface land electrodes with a certain pattern, and the inductor AL2, the capacitor AC1, the inductor 17B, the switch IC 11A, and the SAW duplexers 16B and 16C which are defined by surface-mount circuit elements are mounted thereon.

In the electrically insulating layers 101B, 102B, and 103B on the top-surface side of the multilayer body 100B, connection conductors 500 arranged to connect the above-described mounted circuit elements to internal circuit elements (the inductor AL1A, a capacitor Ca, and individual capacitors defining a plurality of capacitor groups (C groups) described below) are provided with a pattern realizing the circuit illustrated in FIG. 8.

In the electrically insulating layer 104B, a first inner-layer ground 401B is arranged. The first inner-layer ground 401B is provided over almost the entire area of the electrically insulating layer 104B.

In the electrically insulating layer 105B, a flat-plate conductor is arranged so as to face the first inner-layer ground 401B in a certain area. Accordingly, an inner-layer capacitor Ca is defined. The capacitor Ca serves as a capacitor providing the LPF 13B and the BPF 14B.

In the electrically insulating layers 106B, 107B, 108B, and 109B, loop conductors, which are preferably loop shaped or substantially loop shaped, are respectively provided. The loop conductors in the individual electrically insulating layers 106B to 109B are arranged such that the inner-side openings thereof substantially match each other in plan view of the multilayer body 100B. The loop conductors in the individual electrically insulating layers 106B to 109B are preferably connected to one another by via-conductors. Accordingly, a substantially spiral coil conductor having an axis extending in the stacking direction is defined. This coil conductor serves as the inductor AL1A.

In the electrically insulating layers 110B, 111B, and 112B, flat-plate conductors are respectively arranged. These flat-plate conductors are arranged so as to face one another in the stacking direction. Accordingly, inner-layer capacitor groups (C groups) are provided. The plurality of capacitors defining the capacitor groups (C groups) serve as the capacitors providing the LPF 13B and the BPF 14B. The individual flat-plate conductors in the electrically insulating layers 110B, 111B, and 112B are preferably arranged so as not to overlap the loop conductors defining the inductor AL1A in plan view of the multilayer body 100B. Accordingly, unnecessary coupling between the plurality of capacitors defining the capacitor groups (C groups) and the inductor AL1A can be significantly reduced and prevented.

In the electrically insulating layer 113B, a second inner-layer ground 402B is provided. The second inner-layer ground 402B is preferably arranged over almost the entire area of the electrically insulating layer 113B.

The high-frequency module 10B having the above-described configuration has the following features.

The end portion on the electrically insulating layer 106B side of the coil conductor is preferably connected to the top-surface land electrode on which the common terminal Pcom of the switch IC 11B is mounted, via the wiring conductor 201B composed of only a via-conductor. In the electrically insulating layer 104B, the first inner-layer ground 401B is preferably not arranged in a certain range whose substantial center is a position through which the wiring conductor 201B extends.

With this configuration, the wiring conductor 201B can preferably be shortened. Also, the direction in which the wiring conductor 201B extends is preferably perpendicular or substantially perpendicular to the flat surface of the first inner-layer ground 401B, and thus a parasitic capacitance caused by the wiring conductor 201B is not generated or is only barely generated. That is, the parasitic capacitance generated by the wiring conductor 201B can be extremely decreased.

Furthermore, as illustrated in FIG. 9, a distance GapB between the loop conductor in the electrically insulating layer 106B defining the coil conductor and the first inner-layer ground 401B is long. Specifically, the distance GapB is preferably longer than a distance GapA, which is the distance between the loop conductor in the electrically insulating layer 109B defining the coil conductor and the second inner-layer ground 402B (Gap B>Gap A).

With this configuration, the distance between the loop conductor in the electrically insulating layer 106B defining the coil conductor and the first inner-layer ground 401B is long, and a parasitic capacitance can be decreased. Accordingly, a parasitic capacitance applied to the vicinity of the connection terminal on the inductor AL1A side of the wiring conductor 201B can be decreased. The distance GapB may be set to be long enough to acquire necessary insertion loss characteristics by simulation or the like.

The end portion on the electrically insulating layer 109B side of the coil conductor is connected to the mount land permitting external connection of the antenna connection terminal $P_M$(ANT) of the high-frequency module 10B via the wiring conductor 202B which is defined by a via-conductor and a connection conductor.

Here, as illustrated in FIG. 9, the distance GapA is shorter than the distance GapB (Gap B>Gap A). With this configuration, the height of the high-frequency module 10B can be decreased.

As described above, with the configuration according to the third preferred embodiment, the height of the high-frequency module 10B can be decreased as much as possible and an insertion loss can be decreased, even in a case where the inductor AL1A of the matching circuit 12B is disposed in the multilayer body 100B.

In the above-described high-frequency module, an insertion loss can be further decreased by separating a wiring conductor connected to an input/output terminal of a switch IC from an inner-layer ground. For example, in a case where the foregoing coil conductor is arranged in a multilayer body, a wiring conductor connected to an input/output terminal of a switch IC may be arranged in a substantially center layer among electrically insulating layers defining the coil conductor.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A high-frequency module comprising:
an antenna connection terminal which is connected to an antenna;
a plurality of input/output terminals to which communication signals are input or from which communication signals are output, respectively;
a switch IC that includes a plurality of switch terminals which are individually connected to the plurality of input/output terminals, and a common terminal which is connected to the antenna connection terminal, and that connects the common terminal to each of the plurality of switch terminals in a switching manner;
a matching circuit which is connected between the common terminal of the switch IC and the antenna connection terminal; and
a multilayer body including a plurality of electrically insulating layers which are stacked on top of one another; wherein
the switch IC is mounted on one principal surface of the multilayer body;
the matching circuit includes a first inductor which is connected in series between the common terminal of the switch IC and the antenna connection terminal; and
a first wiring line, which connects one end of the first inductor and the common terminal, is shorter than a second wiring line, which connects the other end of the first inductor and the antenna connection terminal.

2. The high-frequency module according to claim 1, wherein the first wiring line is disposed so as not to overlap an inner-layer ground in the multilayer body in a stacking direction of the multilayer body.

3. The high-frequency module according to claim 1, wherein
the first inductor is a surface-mount inductor which is mounted on the one principal surface; and
a first mount land which is provided to the first inductor and is connected to the first wiring line is nearer to a common-terminal mount land on which the common terminal is mounted than a second mount land which is provided to the first inductor and is connected to the second wiring line.

4. The high-frequency module according to claim 1, wherein the first wiring line has a width which is smaller than a width of the second wiring line.

5. The high-frequency module according to claim 1, wherein
the first inductor includes a plurality of loop shaped or substantially loop shaped linear conductors which are respectively arranged in certain electrically insulating layers among the plurality of electrically insulating layers, and is spiral shaped or substantially spiral shaped with a winding axis extending in the stacking direction; and
a linear conductor in a top layer among the plurality of linear conductors is connected to a common-terminal mount land on which the common terminal is mounted, only through a via-conductor extending in the stacking direction.

6. The high-frequency module according to claim 5, wherein
the inner-layer ground includes a first inner-layer ground disposed on an upper side of the plurality of linear conductors, and a second inner-layer ground disposed on a lower side of the plurality of linear conductors; and
a distance in the stacking direction between the linear conductor in the top layer and the first inner-layer ground is longer than a distance in the stacking direction between a linear conductor in a bottom layer among the plurality of linear conductors and the second inner-layer ground.

7. The high-frequency module according to claim 1, wherein the matching circuit further includes a second inductor which is connected between an end portion on a common terminal side of the first inductor and ground.

8. The high-frequency module according to claim 7, wherein the matching circuit further includes a capacitor which is connected between an end portion on an antenna connection terminal side of the first inductor and ground.

9. The high-frequency module according to claim 1, wherein an end portion on a first inductor side of the second inductor is connected to the end portion on the common terminal side of the first inductor via a wiring conductor.

10. The high-frequency module according to claim 1, wherein the plurality of switch terminals are individually connected to the plurality of input/output terminals through wiring conductors.

11. The high-frequency module according to claim 1, wherein the matching circuit is a band-pass-filter matching circuit including a high pass filter and a low pass filter.

12. The high-frequency module according to claim 8, wherein the switch IC, the second inductor, and the capacitor are all surface-mount elements.

13. A high-frequency module comprising:
an antenna connection terminal which is connected to an antenna;
a plurality of input/output terminals to which communication signals are input or from which communication signals are output, respectively;
a switch IC that includes a plurality of switch terminals which are individually connected to the plurality of input/output terminals, and a common terminal which is connected to the antenna connection terminal, and that connects the common terminal to each of the plurality of switch terminals in a switching manner; and
a matching circuit which is connected between the common terminal of the switch IC and the antenna connection terminal; wherein
the switch IC is mounted on one principal surface of the high-frequency module;
the matching circuit includes a first inductor which is connected in series between the common terminal of the switch IC and the antenna connection terminal; and
a first wiring line, which connects one end of the first inductor and the common terminal, is shorter than a second wiring line, which connects the other end of the first inductor and the antenna connection terminal.

14. The high-frequency module according to claim 13, wherein the first wiring line is disposed so as to not overlap an inner-layer ground when viewed from a direction normal to the one principal surface.

15. The high-frequency module according to claim 13, wherein the matching circuit further includes a second inductor which is connected between an end portion on a common terminal side of the first inductor and ground.

16. The high-frequency module according to claim 15, wherein the matching circuit further includes a capacitor which is connected between an end portion on an antenna connection terminal side of the first inductor and ground.

17. The high-frequency module according to claim 13, wherein an end portion on a first inductor side of the second inductor is connected to the end portion on the common terminal side of the first inductor via a wiring conductor.

18. The high-frequency module according to claim 13, wherein the plurality of switch terminals are individually connected to the plurality of input/output terminals through wiring conductors.

19. The high-frequency module according to claim 13, wherein the matching circuit is a band-pass-filter matching circuit including a high pass filter and a low pass filter.

20. The high-frequency module according to claim 16, wherein the switch IC, the second inductor, and the capacitor are all surface-mount elements.

* * * * *